United States Patent
Wu et al.

(10) Patent No.: US 7,279,913 B2
(45) Date of Patent: Oct. 9, 2007

(54) TESTING ASSEMBLY FOR ELECTRICAL TEST OF ELECTRONIC PACKAGE AND TESTING SOCKET THEREOF

(75) Inventors: Hsin-Kuan Wu, Hsin-Tien (TW); Hsing-Chou Hsu, Hsin-Tien (TW); Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 9 days.

(21) Appl. No.: 11/302,741

(22) Filed: Dec. 13, 2005

(65) Prior Publication Data
US 2006/0284634 A1    Dec. 21, 2006

(30) Foreign Application Priority Data
Jun. 20, 2005    (TW)    ............... 94120390 A

(51) Int. Cl.
*G01R 31/02*    (2006.01)

(52) U.S. Cl. .................................... 324/754

(58) Field of Classification Search .............. None
See application file for complete search history.

(56) References Cited

U.S. PATENT DOCUMENTS

| | | | |
|---|---|---|---|
| 5,600,257 A * | 2/1997 | Leas et al. .................. 324/754 |
| 6,400,169 B1 * | 6/2002 | Hembree .................... 324/755 |
| 6,462,573 B1 * | 10/2002 | McAllister et al. ......... 324/757 |
| 2004/0046581 A1 * | 3/2004 | Maekawa et al. ........... 324/755 |

* cited by examiner

*Primary Examiner*—Jermele Hollington
(74) *Attorney, Agent, or Firm*—J.C. Patents

(57) ABSTRACT

A testing assembly for an electrical test of an electronic package is provided. The testing assembly includes a testing circuit board and a testing socket mounted thereon. The testing socket includes an insulating body and a plurality of pins. The insulating body has a holding surface for supporting a contact surface of the electronic package, and at least one low-dielectric constant region located between two neighboring pins, and the dielectric constant of the low-electric constant region is lower than other regions of the insulating body. In addition, the pins passing through the insulating body are configured as the electric channels between a plurality of contacts on the contact surface and a plurality of testing pads on a conductive layer on a surface of the testing circuit board. Furthermore, the pins include a signal pin, and one end of the signal pin is electrically coupled to the signal testing pad.

11 Claims, 3 Drawing Sheets

TESTING ASSEMBLY FOR ELECTRICAL TEST OF ELECTRONIC PACKAGE AND TESTING SOCKET THEREOF

CROSS-REFERENCE TO RELATED APPLICATION

This application claims the priority benefit of Taiwan application serial no. 94120390, filed on Jun. 20, 2005. All disclosure of the Taiwan application is incorporated herein by reference.

BACKGROUND OF THE INVENTION

1. Field of the Invention

The present invention relates to a testing assembly, and more particularly, to a testing assembly for an electrical test of an electronic package.

2. Description of the Related Art

After the integrated circuit (IC) chip had been packaged into an electronic package, a component test is usually performed on the testing assembly to ensure the quality of the package by identifying the characteristic parameters of the package. In addition, in order to ensure that the package operates normally in a computer system after installed into the computer system, a system test is further performed on the package, and it is a necessary process for the package of high-end or high-cost IC chip.

However, various testing assemblies should be designed with respect to the different types of the packages. Regarding the package of the Ball Grid Array (BGA) type, the testing assembly comprises a testing circuit board and a testing socket mounted thereon. The testing socket comprises an insulating body and a plurality of pogo-pins, wherein the pogo-pins pass through the insulating body, and the arrangement of the pogo-pins corresponds to the disposition of the spherical contacts of the BGA package to be tested. In addition, a part of the surface of the testing circuit board contains a plurality of testing pads, and each testing pad is corresponding to one pogo-pin of the testing socket. Thus, the bottom of the pogo-pins elastically contact with the testing pads respectively.

When the BGA package is mounted on the testing socket and the contact surface of the BGA package contact with the holding surface of the insulating body, the top of the pogo-pins contact with the spherical contacts on the contact surface of the BGA package respectively, such that the pogo-pins are configured as the electric channels between the spherical contacts of the BGA package and the testing pads of the testing circuit board respectively. Accordingly, the BGA package is electrically coupled to the testing circuit board via the testing socket, such that the electrical test can be performed on the IC chip inside the BGA package.

However, compared with the conducting trace of the BGA package and/or the conducting trace of the testing circuit board, the impedance of the pogo-pins on the testing socket is rather low, thus causing the impedance mismatch in the entire signal transmission path, and reducing the return loss of the signal transmission. This significantly deteriorates the testing accuracy of the testing assembly.

SUMMARY OF THE INVENTION

Therefore, it is an object of the present invention to provide a testing assembly for an electrical test of an electronic package to improve the impedance continuity of the signal transmission path.

It is another object of the present invention to provide a testing socket for an electrical test of an electronic package to improve the impedance continuity of the signal transmission path.

In order to achieve the objects mentioned above or others, the present invention provides a testing assembly for an electrical test of an electronic package. The electronic package has a plurality of contacts disposed on a contact surface of the electronic package. The testing assembly comprises a testing circuit board and a testing socket. The testing circuit board has a plurality of testing pads on a conductive layer, and the conductive layer is disposed on a surface of the testing circuit board. The testing socket is mounted on the testing circuit board. The testing socket comprises an insulating body and a plurality of pins. The insulating body has a holding surface for supporting a contact surface of the electronic package, and has at least one low-dielectric constant region, wherein the dielectric constant of the low-dielectric constant region is lower than the one in other regions of the insulating body. The pins passing through the insulating body are configured as the electric channels between the contacts and the testing pads, and the low-dielectric constant regions are located on a side edge of one of the pins.

In summary, in the present invention, the low-dielectric constant region is formed in the insulating body of the testing socket between a signal pin and a reference pin of the pins for directly reducing an equivalent capacitance induced between the signal pin and the reference pin, such that the high capacitance of the signal pin is compensated, and the impedance continuity of the signal transmission path is further improved.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF EMBODIMENTS

Figure 1:
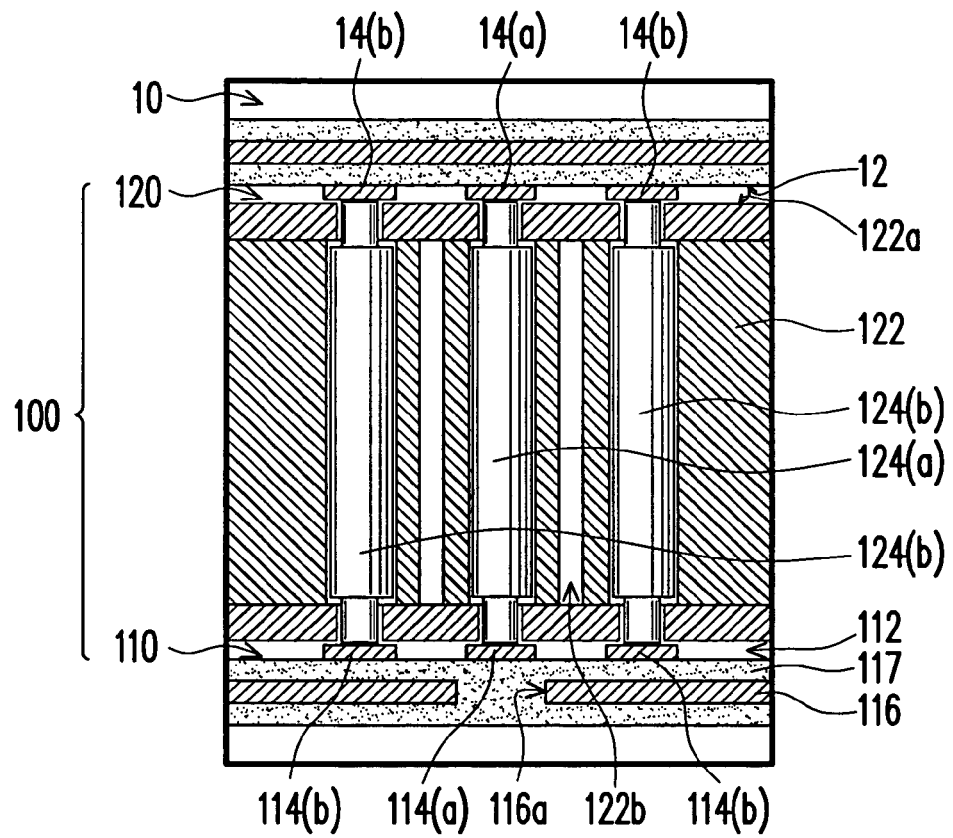
FIG. 1 is a partial vertical cross-sectional view of a testing assembly according to a first embodiment of the present invention.

FIG. 1 is a partial vertical cross-sectional view of a testing assembly according to a first embodiment of the present invention. A testing assembly 100 of a first embodiment of the present invention is suitable for the electrical test of an area array contact package 10, such as a Land Grid Array (LGA) package, a Ball Grid Array (BGA) package, or a Pin Grid Array (PGA) package, and it is also suitable for the electrical test of the peripheral contact package 10, such as a Quad Flat No-lead (QFN) package. In the first embodiment, the package 10 is a LGA type package for example, and only a portion of the package substrate of the package 10 is used herein to represent the package 10. In addition, the package 10 has a plurality of contacts 14, and the contacts 14 are disposed on a contact surface 12 of the package 10.

The testing assembly 100 of the first embodiment comprises a testing circuit board 110 and a testing socket 120. The testing socket 120 is mounted on the testing circuit board 110 in a fixed or replaceable manner. The testing socket 120 comprises an insulating body 122 and a plurality of pins 124 passing through the insulating body 122. The arrangement of the pins 124 corresponds to the disposition of the contacts 14 of the package 10 to be tested. In addition, the testing circuit board 110 further comprises a patterned conductive layer 112 to form a plurality of testing pads 114. The testing pads 114 are correspondingly disposed below the testing socket 120 and contact with the bottom of the pins 124, respectively.

After the package 10 is mounted on the testing socket 120 and the contact surface 12 of the package 10 contact with the holding surface 122a of the insulating body 122, the top of the pins 124 contact with the contacts 14 on the contact surface 12 of the package 10, respectively. Accordingly, the pins 124 are configured as the electric channels between the contacts 14 and the testing pads 114, respectively. In other words, it is used as the electric channels between the package 10 and the testing circuit board 110. Consequently, the package 10 is electrically coupled to the testing circuit board 110 via the testing socket 120, such that the electrical test can be performed on the IC chip (not shown) inside the package 10. Note that the pins 124 inside the insulating body 122 may be pogo-pins, which is elastic in response to the external force applied on them, so as to ensure that the top ends of the pins 124 contact with the contacts 14 on the contact surface 12 of the package 10, respectively.

In accordance with the circuit design of the package 10, the package 10 has a signal contact 14a and a plurality of reference contacts 14b on its contact surface 12. The reference contacts 14b and the signal contact 14a may be formed by the same patterned conductive layer (not shown), and the reference contacts 14b are disposed in the periphery of the signal contact 14a. According to the type of the reference terminal, which the reference contacts 14b is connected to, such as a ground terminal or a power terminal, the reference contacts 14b may be the non-signal contacts such as ground contacts or power contacts.

Corresponding to the signal contact 14a of the package 10, the testing circuit board 110 comprises a signal testing pad 114a. In addition, corresponding to the reference contacts 14b of the package 10, the testing circuit board 110 further comprises a plurality of reference testing pads 114b. Similarly, according to the type of the reference terminal, which the reference contacts 14b is connected to, the reference testing pads 114b may be non-signal testing pads such as ground testing pads or power testing pads. Moreover, the testing circuit board 110 further comprises a reference plane 116, which may be a ground plane or a power plane of a conductive layer inside the testing circuit board 110. The reference plane 116 is disposed below the testing pads 114 (i.e. the patterned conductive layer 112) and insulated by an insulation layer 117. Due to the impedance and the capacitance caused by the dimension of the pins 124, the pins 124, configured as the electric channels between the package 10 and the testing circuit board 110, has non-continuous impedance, thus the signal cannot be completely transmitted.

Figure 2:
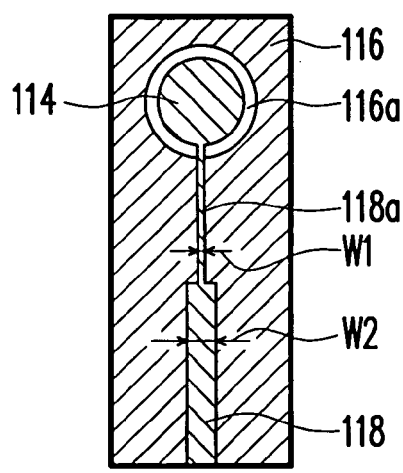
FIG. 2 is a top view illustrating the structure of the conductive layer and the reference plane of FIG. 1.

FIG. 2 is a top view illustrating the structure of the conductive layer and the reference plane of FIG. 1. Referring to FIG. 1 and FIG. 2, the equivalent formula of the impedance is the square root of L/C, wherein L is an equivalent inductance, and C is an equivalent capacitance. In the first embodiment, in order to compensate the discontinuous impedance due to the pins 124 (especially, the signal pin 124a) by reducing the equivalent capacitance, a non-conductive region 116a is further disposed on the reference plane 116 of the testing circuit board 110. For example, the non-conductive region 116a may be an etched region or an opening on the reference plane 116, and the non-conductive region 116a is disposed below the testing pad 114. For instance, the non-conductive region 116a may be disposed below the signal testing pad 114a. Accordingly, the equivalent inductance induced between the signal testing pad 114a and the reference plane 116 can be effectively reduced and thus the high capacitance of the pins 124 is compensated, such that the impedance continuity of the signal transmission path passing through the pins 24 is further improved.

Referring to FIG. 1 and FIG. 2, in order to compensate the non-continuous impedance caused by the pins 124 (especially, the signal pin 124a) by increasing the equivalent inductance, in the first embodiment, a compensation part 118a of a conductive trace 118 formed of the patterned conductive layer 112 and connected to the signal testing pad 114a, wherein the line width W1 of the compensation part 118a is less than the line width W2 of other regions of the conductive trace 118. In other words, the sectional area of the compensation part 118a in the conductive trace 118 is less than the sectional area of other regions in the conductive trace 118. Accordingly, the equivalent inductance induced between the reference plane 116 and the narrower compensation part 118a of the conductive trace 118 is increased, such that the high capacitance of the pins 124 is compensated, and the impedance continuity of the signal transmission path passing through the pins 124 is further improved.

Figure 3:
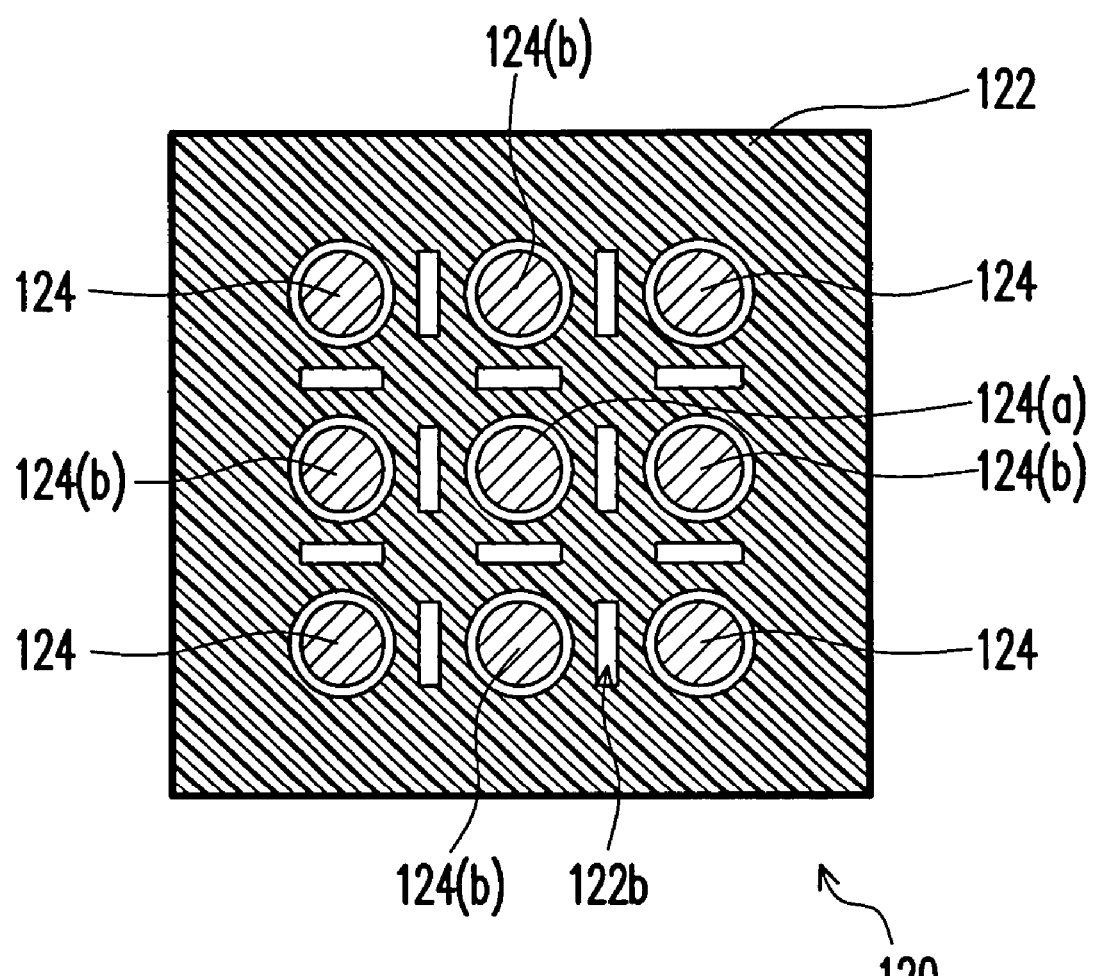
FIG. 3 is a partial horizontal cross-sectional view of the testing socket of FIG. 1.

FIG. 3 is a partial top view of the testing socket of FIG. 1. Referring to FIG. 1 and FIG. 3, when the reference pins 124b (e.g. a ground pin or a power pin) are disposed outside the signal pin 124a, in order to reduce the equivalent capacitance induced between the signal pin 124a and the reference pins 124b, in the first embodiment, the insulating body 122 further comprises a plurality of low-dielectric constant regions 122b, such as a plurality of empty slots containing the air disposed between the signal pin 124a and the reference pins 124b, respectively. The dielectric constant of the low-dielectric constant regions 122b is lower than the one in other regions of the insulating body 122. Consequently, the equivalent inductance induced between the signal pin 124a and the reference pins 124b is directly reduced by the low-dielectric constant regions 122b, such that the high capacitance of the signal pin 124a is compensated, and the impedance continuity of the signal transmission path passing through the signal pin 124a is further improved.

Figure 4:
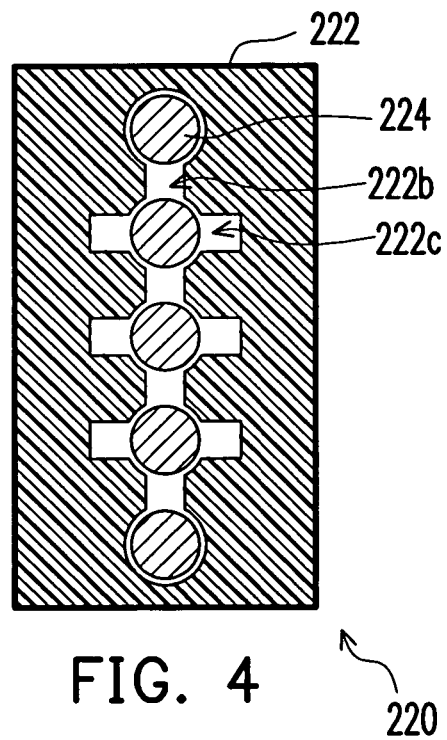
FIG. 4 is a partial horizontal cross-sectional view of the testing socket in a testing assembly according to a second embodiment of the present invention.

FIG. 4 is a partial horizontal cross-sectional view of the testing socket in a testing assembly according to a second embodiment of the present invention. The difference between the second embodiment and the first embodiment is the location of the low-dielectric constant regions of the insulating body in the testing socket. An insulating body 222 of a testing socket 220 in a testing assembly of the second embodiment comprises a plurality of first low-dielectric constant regions 222b and a plurality of second low-dielectric constant regions 222c. The first low-dielectric constant regions 222b are disposed between two neighboring pins 224, and the second low-dielectric constant regions 222c are disposed on a side edge of the pins 224 rather than disposed between two neighboring pins 224.

If these two neighboring pins 224 are a signal pin and a reference pin, the equivalent inductance induced between these two pins 224 is reduced by both the first low-dielectric constant regions 222b and the second low-dielectric constant regions 222c, such that the high capacitance of the signal pin is compensated, and the impedance continuity of the signal transmission path passing through the signal pin is further improved. In addition, if these two neighboring pins 224 are served as a differential signal pair, the interference incurred between this differential signal pair is reduced by both the first low-dielectric constant regions 222b and the second low-dielectric constant regions 222c, such that the signal transmission quality transmitting in this differential signal pair is improved.

Figure 5:
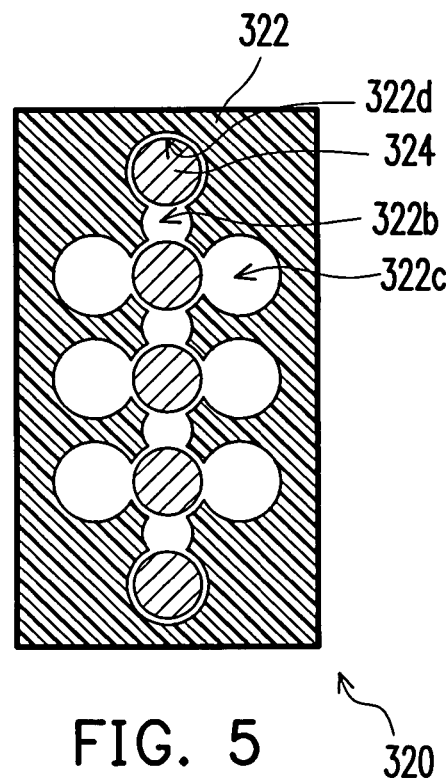
FIG. 5 is a partial horizontal cross-sectional view of the testing socket in a testing assembly according to a third embodiment of the present invention.

FIG. 5 is a partial horizontal cross-sectional view of the testing socket in a testing assembly according to a third embodiment of the present invention. The difference between the third embodiment and the second embodiment is the sectional profile of the first low-dielectric constant regions and the second low-dielectric constant regions. Similarly, an insulating body 322 of a testing socket 320 in a testing assembly of the third embodiment comprises a plurality of first low-dielectric constant regions 322b and a plurality of second low-dielectric constant regions 322c. The first low-dielectric constant regions 322b are disposed between two neighboring pins 324, and the second low-dielectric constant regions 322c are disposed on a side edge of the pins 324 rather than disposed between two neighboring pins 324.

In order to form the first low-dielectric constant regions 322b and the second low-dielectric constant regions 322c in the insulating body 322, a plurality of drill holes are formed in the insulating body 322, and the drill holes are used as the first low-dielectric constant regions 322b and the second low-dielectric constant regions 322c. In addition, the electrical performance of the testing socket 320 is improved by modifying the location and the diameter of the drill holes. Moreover, if the through holes 322d that the pins 324 pass through are formed in the insulating body 322 by mechanical drilling, the drilled holes used as the first low-dielectric constant regions 322b and the second low-dielectric constant regions 322c are formed together with the through holes 322d. Accordingly, the manufacturing of the first low-dielectric constant regions 322b and the second low-dielectric constant regions 322c in the insulating body 320 is simplified.

In summary, the testing assembly and the testing socket of the present invention have at least the following advantages:

(1) The low-dielectric constant regions are formed in the insulating body in the testing socket between the signal pin and the reference pins to reduce the equivalent capacitance induced between the signal pin and the reference pins. Accordingly, the high capacitance of the signal pin is compensated, and the impedance continuity of the signal transmission path passing through the signal pin is further improved, thus enhancing the accuracy of the testing result.

(2) The low-dielectric constant regions are formed in the insulating body in the testing socket between a differential signal pair to reduce the interference incurred between this differential signal pair, such that the signal transmission quality transmitting in this differential signal pair and the accuracy of the testing result are improved.

(3) The drill holes are formed in the insulating body of the testing socket by mechanical drilling or other mechanical process to serve as the low-dielectric constant regions, such that the accuracy of the testing result is improved with a lower cost.

(4) A non-conductive region is formed on the reference plane of the testing circuit board to reduce the equivalent capacitance induced between the reference plane and the signal testing pads. Accordingly, the high capacitance of the signal pin is compensated, and the impedance continuity of the signal transmission path passing through the signal pin is further improved, thus enhancing the accuracy of the test result.

(5) A compensation part is further formed on a part of the conductive trace electrically coupled to the signal testing pads, and the line width of the compensation part on the conductive trace is less than the line width of other regions of the conductive trace, such that the equivalent inductance induced between the reference plane and the narrower compensation part of the conductive trace is improved. Accordingly, the high capacitance of the signal pin is compensated, and the impedance continuity of the signal transmission path passing through the signal pin is further improved, which also improves of the accuracy of the test result.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A testing assembly for an electrical test of an electronic package, the electronic package comprising a plurality of contacts disposed on a contact surface of the electronic package, the testing assembly comprising:
    a testing circuit board, comprising:
        a conductive layer disposed on a surface of the testing circuit board having a plurality of testing pads;
        an insulating layer: and
        a reference plane overlaid with the conductive layer, insulated from the conductive layer by the insulating layer, and comprising at least one non-conductive region disposed corresponding to one of the testing pads; and
    a testing socket disposed on the testing circuit board, comprising:
        an insulating body comprising a holding surface for supporting the contact surface of the electronic package, and at least a low-dielectric constant regions, wherein a dielectric constant of the low-dielectric constant region is lower than a dielectric constant of other regions in the insulating body; and
        a plurality of pins passing through the insulating body to serve as the electric channels between the contacts and the testing pads, and the low-dielectric constant regions are disposed on a side edge of one of the pins.

2. The testing assembly of claim 1, wherein the low-dielectric constant regions are disposed between two neighboring pins of the plurality of pins.

3. The testing assembly of claim 1, wherein one of the two neighboring pins is a signal pin, and the other one is a reference pin.

4. The testing assembly of claim 1, wherein the two neighboring pins are served as a differential signal pair.

5. The testing assembly of claim 1, wherein the low-dielectric constant regions are containing air.

6. The testing assembly of claim 1, wherein the pins are pogo-pins.

7. The testing assembly of claim 1, wherein the non-conductive region is an etched region on the reference plane.

8. The testing assembly of claim 1, wherein the testing pad corresponding to the non-conductive region is a signal testing pad.

9. The testing assembly of claim 8, wherein the conductive layer further comprises a conductive trace having one end electrically coupled to the signal testing pad, and the conductive trace comprises a compensation part electrically coupled to the signal testing pad, and the sectional area of the compensation part is less than the sectional area of other regions of the conductive trace.

10. The testing assembly of claim 8, wherein the testing pads comprise a non-signal testing pad disposed adjacent to the signal testing pad.

11. The testing assembly of claim 8, wherein the testing pads comprise a plurality of non-signal testing pads disposed in the periphery of the signal testing pad.

* * * * *